(12) United States Patent
Lee et al.

(10) Patent No.: US 7,432,648 B2
(45) Date of Patent: Oct. 7, 2008

(54) MICROCAVITY ELECTROLUMINESCENT DISPLAY WITH PARTIALLY REFLECTIVE ELECTRODES

(75) Inventors: Jun-Yeob Lee, Seongnam-si (KR); Han-Ju Lee, Seoul (KR); Jun-Sik Oh, Yongin-si (KR)

(73) Assignee: Samsung SDI Co., Ltd., Suwon (KR)

( * ) Notice: Subject to any disclaimer, the term of this patent is extended or adjusted under 35 U.S.C. 154(b) by 145 days.

(21) Appl. No.: 10/886,546

(22) Filed: Jul. 9, 2004

(65) Prior Publication Data

US 2005/0012455 A1  Jan. 20, 2005

(30) Foreign Application Priority Data

Jul. 19, 2003 (KR) ............... 10-2003-0049543
Aug. 7, 2003 (KR) ............... 10-2003-0054794

(51) Int. Cl.
*H05B 33/00* (2006.01)
*H01L 51/50* (2006.01)

(52) U.S. Cl. .................. 313/506; 313/504
(58) Field of Classification Search ......... 313/504–506; 428/690
See application file for complete search history.

(56) References Cited

U.S. PATENT DOCUMENTS 5,301,204 A * 4/1994 Cho et al. ............... 372/69
6,469,437 B1 10/2002 Parthasarathy et al. ...... 313/504
6,897,474 B2 * 5/2005 Brown et al. ............. 257/40
2004/0155576 A1 * 8/2004 Tyan et al. .............. 313/504

FOREIGN PATENT DOCUMENTS

KR  10-2003-0002182  1/2003

OTHER PUBLICATIONS

Lu, M.H.; Weaver, M.S.; Zhou, T.X.; Rothman, M.; Kwong, R.C.; Hack, M.; and Brown, J.J.; "High-Efficiency Top-Emitting Organic Light-Emitting Devices," Applied Physics Letters, vol. 81, No. 21, Nov. 18, 2002, pp. 3921-3923.*

* cited by examiner

*Primary Examiner*—Nimeshkumar D. Patel
*Assistant Examiner*—Anne M Hines
(74) *Attorney, Agent, or Firm*—H.C. Park & Associates, PLC

(57) ABSTRACT

An EL display is provided with enhanced light emission characteristics wherein light emitted from a light-emitting layer undergoes constructive interference due to a resonance effect. The EL display includes a transparent substrate, an anode and a cathode formed on the same side of the transparent substrate, and an intermediate layer interposed between the anode and the cathode, and said intermediate layer including a light-emitting layer that emits light when the anode and the cathode are electrically driven by a voltage, and wherein the anode and the cathode are formed as a translucent conductive layer that partially reflects the light emitted from the light-emitting layer.

17 Claims, 3 Drawing Sheets

MICROCAVITY ELECTROLUMINESCENT DISPLAY WITH PARTIALLY REFLECTIVE ELECTRODES

CROSS-REFERENCE TO RELATED APPLICATIONS

This application claims priority of Korean Patent Application No. 2003-49543, filed on Jul. 19, 2003, and No. 2003-54794, filed on Aug. 7, 2003, in the Korean Intellectual Property Office, both of which hereby are incorporated by reference.

BACKGROUND OF THE INVENTION

1. Field of the Invention

The present invention relates to an electroluminescent display (EL), and more particularly, to a bi-directional emission-type EL display.

2. Description of the Related Art

EL displays are active light-emitting display devices that have numerous advantages over cathode ray tubes (CRTs) or liquid crystal displays (LCDs). EL displays can provide a wider viewing angle, higher contrast, faster response speed, lighter weight, smaller size, thinner thickness, and lower power consumption. There is an increasing interest on developing EL displays as next generation displays. EL displays are classified into inorganic and organic EL displays, depending on whether the light-emitting layer is made of organic or inorganic material.

FIG. 1 shows a conventional bi-directional emission-type EL display having a structure similar to that disclosed in U.S. Pat. No. 6,469,437, which hereby is incorporated by reference. The EL display has a sequentially stacked structure including an anode 20, an intermediate layer 30, and a cathode 40 on a transparent substrate 10. As shown in FIG. 1, the intermediate layer 30 includes a hole injection layer 31, a hole transport layer 32, a light-emitting layer 33, an electron transport layer 34, and an electron injection layer 35. Except for the light-emitting layer 33, the other layers 31,32,34,35 may be omitted, if necessary. Since the EL display is a bidirectional emission-type display, the anode 20 and the cathode 40 are made of a transparent material, such as indium tin oxide (ITO). Light emitted from the light-emitting layer 33 is discharged towards both the anode 20 and the cathode 40. However, since light emitted from the light-emitting layer 33 is not reflected by the anode 20 or the cathode 40, it is impossible to accomplish the enhancement of light emission characteristics by constructive interference due to a resonance effect of light emitted from the light-emitting layer 33. Weak or low amplitude light emitted from the light-emitting layer 33 does not pass through the anode 20 and the cathode 40, and becomes trapped between the anode 20 and cathode 40. Energy from the trapped light is absorbed in the layers interposed between the anode 20 and the cathode 40. Accordingly, light efficiency of the conventional EL display is reduced.

SUMMARY OF THE INVENTION

The present invention provides an EL display in which light emitted from a light-emitting layer undergoes constructive interference due to a resonance effect. As a result, the EL display enhances light emission characteristics such as luminance, light efficiency, and chromaticity. The present invention also provides an EL display that can adjust the amount of light emitted from an anode and a cathode.

In accordance with the present invention, an EL display comprises a transparent substrate, an anode and a cathode formed on the same side of the transparent substrate, and the intermediate layer interposed between the anode and the cathode. The intermediate layer comprises a light-emitting layer that emits light when the anode and the cathode are electrically driven by an applied voltage, wherein the anode and the cathode are formed as a translucent conductive layer that partially reflects the light emitted from the light-emitting layer.

The intermediate layer, interposed between the anode and the cathode, may be formed so that light reflected by the anode and the cathode undergoes constructive interference due to a resonance effect.

The anode comprises a first transparent conductive layer that transmits light and a first partially reflective layer that partially reflects light, and the cathode comprises a second transparent conductive layer that transmits light and a second partially reflective layer that partially reflects light.

The first partially reflective layer is formed on an inner surface or an outer surface of the first transparent conductive layer. When the first transparent conductive layer includes a first inner transparent conductive layer and a first outer transparent conductive layer, the first partially reflective layer is formed in between.

The second partially reflective layer is formed on an inner surface or an outer surface of the second transparent conductive layer. When the second transparent conductive layer includes a second inner transparent conductive layer and a second outer transparent conductive layer, the second partially reflective layer is formed in between.

The layers interposed between the first partially reflective layer and the second partially reflective layer may be formed so that light reflected by the first partially reflective layer and the second partially reflective layer undergoes constructive interference due to a resonance effect.

The first transparent conductive layer and the second transparent conductive layer may be made of a transparent material selected from the group consisting of ITO, IZO, and ZnO.

The first partially reflective layer may be made of a partially reflective material selected from the group consisting of Ag, Mg, Al, Pt, Pd, Au, Ni, Ir, and Cr, and the second partially reflective layer may be made of a partially reflective material selected from the group consisting of Mg:Ag, Mg, Ca, Al, Ag, and Ba.

The first transparent conductive layer and the second transparent conductive layer preferably have a thickness of 50 to 300 nm. The first partially reflective layer and the second partially reflective layer may have a thickness of 3 to 30 nm. The distance between the first partially reflective layer and the second partially reflective layer may be in the range of 50 to 500 nm.

DETAILED DESCRIPTION OF THE INVENTION

Figure 1:
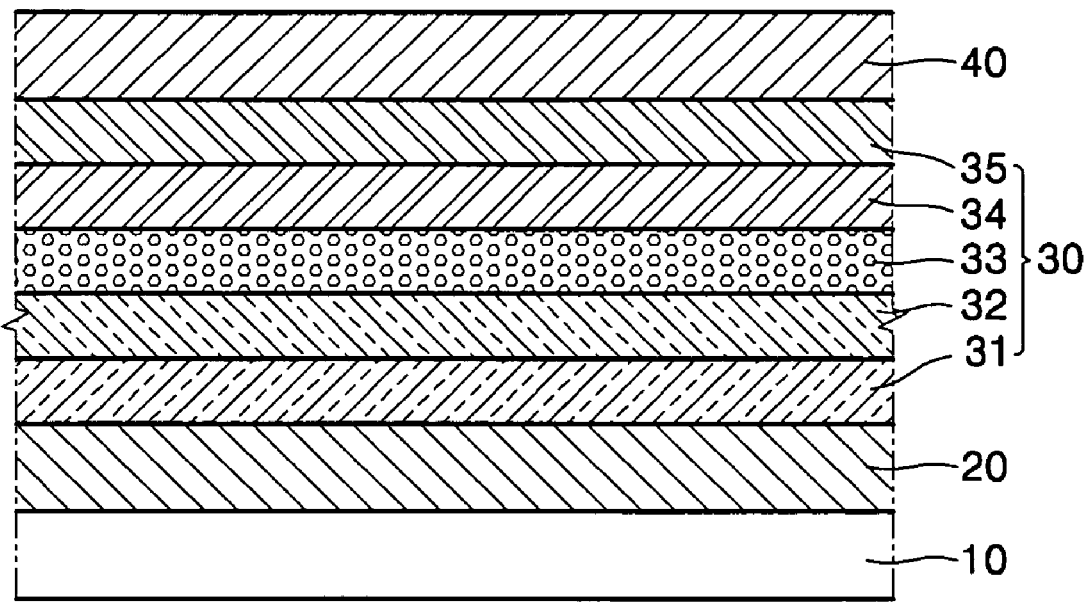
FIG. 1 is a cross-sectional view of a conventional bi-directional emission-type EL display.
Figure 2:
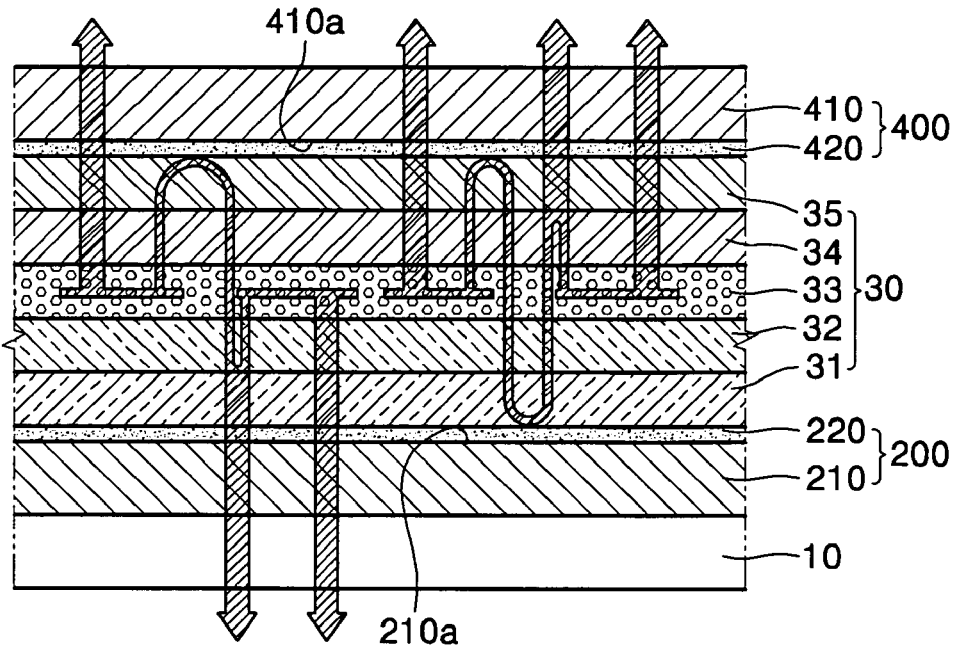
FIG. 2 is a cross-sectional view of an EL display configured in accordance to a first embodiment of the present invention.

FIG. 2 illustrates one sub-pixel of a passive matrix EL display configured in accordance to one embodiment of the present invention. The EL display is a bi-directional emission-type display including a transparent substrate 10, an anode 200, a cathode 400, and an intermediate layer 30. The transparent substrate 10 may be a glass substrate. The anode 200, the intermediate layer 30, and the cathode 400 are formed on the transparent substrate 10.

The intermediate layer 30 is interposed between the anode 200 and the cathode 400. The intermediate layer 30 includes a light-emitting layer 33 that emits light when a voltage is applied across the anode 200 and the cathode 400. The intermediate layer 30 includes a hole injection layer 31, a hole transport layer 32, the light-emitting layer 33, an electron transport layer 34, and an electron injection layer 35. While other layers may be omitted if needed, the light-emitting layer 33 cannot be omitted.

The EL display can be an organic EL display or an inorganic EL display, depending upon material comprising the light-emitting layer 33. In an organic EL display, the light-emitting layer 33 is made of phthalocyanine, such as copper phthalocyanine (CuPc), N,N'-di(naphthalene-1-yl)-N,N'-diphenyl benzidine (NPB), or tris-8-hydroxyquinoline aluminium (Alq3), or other similar materials. In an inorganic EL display, the light-emitting layer 33 is made of metal sulfide, such as ZnS, SrS, and CsS or alkaline earth-based calcium sulfide, such as $CaCa_2S_4$ and $SrCa_2S_4$, or other similar materials and light emitting core atoms of transition metals, such as Mn, Ce, Tb, Eu, Tm, Er, Pr, and Pb or alkaline rare earth metals or other similar materials. Although the EL display illustrated in FIG. 2 is an organic display, an inorganic EL display also may be utilized in the present invention. In an inorganic EL display, insulating layers are interposed between the cathode 400 and the light-emitting layer 33, and also between the anode 200 and the light-emitting layer 33.

The anode 200 and the cathode 400 are located on the same side of the transparent substrate 10. The intermediate layer 30, including the light-emitting layer 33, is deposed between the anode 200 and the cathode 400. The anode 200 and the cathode 400 are formed as a translucent conductive layer that partially reflects light emitted from the light-emitting layer 33. Both the anode 200 and the cathode 400 include transparent conductive layers 210 and 410, respectively, and partially reflective layers, 220 and 420, respectively. The first transparent conductive layer 210 transmits light. The first partially reflective layer 220 is formed on an inner surface 210a of the first transparent conductive layer 210.

The cathode 400 includes a second transparent conductive layer 410 that transmits light. A second partially reflective layer 420 of the cathode 400 is formed on an inner surface 410a of the second transparent conductive layer 410. The first and second partially reflective layers 220 and 420 partially reflect light. The layers 31,32,33,34,35 interposed between the first partially reflective layer 220 and the second partially reflective layer 420 are formed having reflective indexes and thicknesses such that light, reflected by the first partially reflective layer 220 and the second partially reflective layer 420, undergoes constructive interference due to a resonance effect.

The first partially reflective layer 220 and the second partially reflective layer 420 reflect relatively weak light emitted from the light-emitting layer 33 that cannot pass through the partially reflective layers 220 and 420. The reflected light gains higher intensity due to constructive interference with other light emitted from the light-emitting layer 33 or other reflected light, and then the reflected light having higher intensity is discharged through one of the partially reflective layers 220 and 420.

Some light emitted from the light-emitting layer 33 vibrates between the anode 200 and the cathode 400. The vibrating light undergoes constructive interference due to resonance corresponding to a particular light wavelength. The layers 31,32,33,34,35 are each designed to have a thickness and refractive index that produces constructive interference of reflected light between the partially reflective layers 220 and 420.

Some of the light emitted from the light-emitting layer 33 has a relatively low intensity and smaller wavelength amplitude, and such light is reflected back by the partially reflective layers 220 and 420 toward the light-emitting layer 33. As the reflected light continues to be reflected between the light emitting layer 33 and the partially reflective layers 220 and 420, the reflected light gains higher intensity and larger wavelength amplitude as a result of constructive interference with higher intensity light emitted by the light-emitting layer 33. After the reflected light gains a minimum intensity as a result of compounding constructive interference, the reflected light is then discharged from the EL layer 33 by passing through the partially reflective layers 220 and 420 and the anode 200 and cathode 400.

As a result of the reflected light undergoing constructive interference and passing through the anode 200 and the cathode 400, in addition to the partially reflective layers 220 and 420, the light efficiency of the EL display is enhanced. Such constructive interference also enhances luminance and chromaticity of the EL display.

The distance between the first partially reflective layer 220 and the second partially reflective layer 420 may be within a range of 50 to 500 nm, considering that the wavelength of visible light is in the range of 380 to 770 nm.

The first transparent conductive layer 210 and the second transparent conductive layer 410 may be made of a transparent material selected from the group consisting of indium tin oxide (ITO), indium zinc oxide (IZO), zinc oxide (ZnO) and other similar materials. The first partially reflective layer 220 may be made of a partially reflective material selected from the group consisting of Ag, Mg, Al, Pt, Pd, Au, Ni, Ir, and Cr or other similar materials. The second partially reflective layer 420 preferably is made of a partially reflective material selected from the group consisting of Mg:Ag, Mg, Ca, Al, Ag, and Ba or other similar materials.

As used in this specification, the term "transparent material" indicates a material preferably having a visible light transmittance of 50% or more with a 100 nm thickness. The term "partially reflective material" preferably indicates a material having both a light reflectivity and a light transmittance of 40% or more, and light absorptivity of less than 30% with a 100 nm thickness.

The amount of light that passes through the first partially reflective layer 220 and the second partially reflective layer 420 can be controlled by adjusting the thickness of the partially reflective layers 220 and 420. In particular, this is useful in a situation where the amount of light passing through the anode 200 and the cathode 400 is required to be relatively equal. In the exemplary embodiment, the first transparent conductive layer 210 and the second transparent conductive layer 410 each have a thickness of 50 to 300 nm. If it is thinner than 50 nm, electrical conductivity is lowered. On the other hand, if it is thicker 300 nm, light transmittance is lowered and material cost increases. Preferably, both the first partially reflective layer 220 and the second partially reflective layer 420 have a thickness of 3 to 30 nm. If it is thinner than 3 nm, light reflectivity decreases excessively. On the other hand, if it is thicker than 30 nm, light transmittance decreases too much.

The EL layer 30, interposed between the first partially reflective layer 220 and the second partially reflective layer 420, may include all or some of the following layers: the hole injection layer 31, the hole transport layer 32, the light-emitting layer 33, the electron transport layer 34, and the electron injection layer 35. The layers 31,32,33,34,35, interposed between the first partially reflective layer 220 and the second partially reflective layer 420, are optimized so that light reflected by the first partially reflective layer 220 and the second partially reflective layer 420 undergoes constructive interference. The thickness of each of the layers 31,32,33,34, 35 is determined by the reflective index of each of these layers and the wavelength of light emitted from the light-emitting layer 33.

Turning now to some examples, discussed below are an example of the present invention compared to an example of a conventional design.

EXAMPLE 1

An EL display was prepared including the transparent substrate 10, the first transparent conductive layer 210 made of ITO on the transparent substrate 10, the first partially reflective layer 220 (20 nm thickness) made of Ag on the first transparent conductive layer 210, the hole injection layer 31 (10 nm thickness) made of CuPc on the first partially reflective layer 220, the hole transport layer 32 (50 nm thickness) made of N,N'-di(1-naphtyl)-N,N'-diphenylbenzidine(NPD) on the hole injection layer 31, the light-emitting layer 33 (30 nm thickness) made of carbazole biphenyl (CBP) doped with 5% tris (fac-phenylpyridien) iridium on the hole transport layer 32, a hole blocking layer (5 nm thickness) made of biphenoxy-bi(8-quinolinolato)aluminum (BAlq) on the light-emitting layer 33, the electron transport layer 34 (20 nm thickness) made of tris(8-quinolinolato)aluminum (Alq) on the hole blocking layer, the electron injection layer 35 (0.5 nm thickness) made of LiF on the electron transport layer 34, the second partially reflective layer 420 (6 nm thickness) made of Mg:Al (20:1) on the electron injection layer 35, and the second transparent conductive layer 410 (80 nm thickness) made of IZO on the second partially reflective layer 420.

When this EL display was driven at 8 volts, light emitted from the anode 200 had 400 cd/M$^2$ of luminance, 14.4 cd/A of light efficiency, and [0.27, 0.65] of chromaticity. Light emitted from the cathode 400 had 210 cd/m$^2$ of luminance, 8.0 cd/A of light efficiency, and [0.27, 0.65] of chromaticity.

COMPARATIVE EXAMPLE 2 (CONVENTIONAL DESIGN)

An EL display was manufactured in the same manner as in the preceding Example 1, except that the first partially reflective layer 220 and the second partially reflective layer 420 were omitted. Comparative Example 2 corresponds to a conventional EL display.

When the EL display was driven at 8 Volts, light emitted from an anode had 335 cd/m$^2$ of luminance, 12.5 cd/A of light efficiency, and [0.28, 0.62] of chromaticity. Light emitted from a cathode had 98 cd/m$^2$ of luminance, 3.6 cd/A of light efficiency, and [0.29, 0.60] of chromaticity.

As seen from Example 1 and Comparative Example 2, the luminance and light efficiency of the EL display according to the exemplary embodiment of the present invention (Example 1) are higher than those of the conventional EL display (Comparative Example 2). In particular, the luminance and efficiency of light emitted from the cathode of the EL display of Example 1 are more than twice that of the light emitted from the cathode of Comparative Example 2. Chromaticity of the preceding Example 1 also is better than that of Comparative Example 2.

Figure 3:
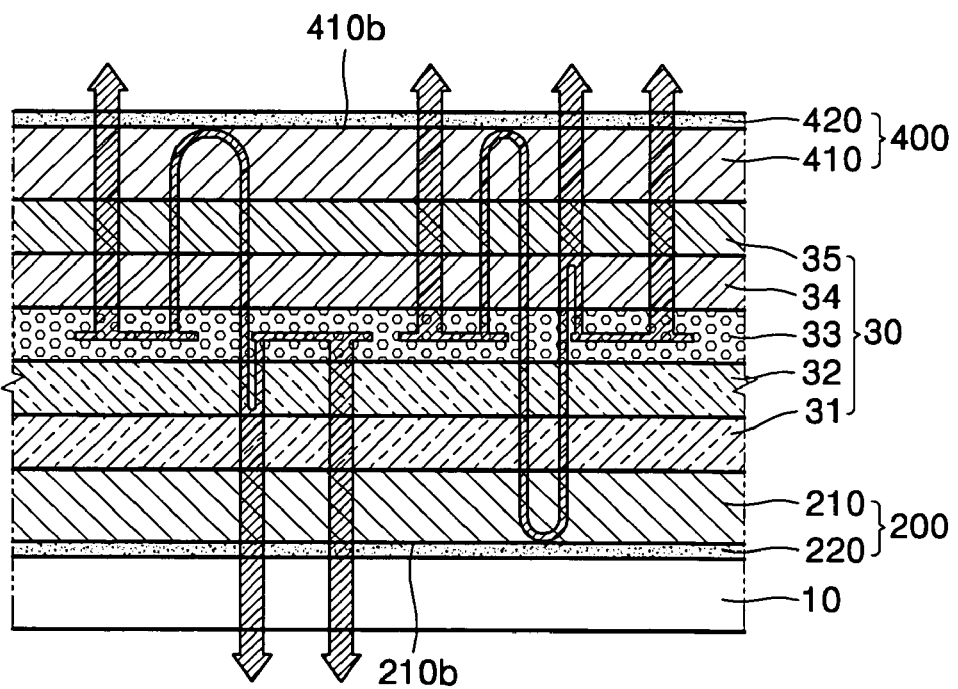
FIG. 3 is a cross-sectional view of an EL display configured in accordance to a second embodiment of the present invention.

FIG. 3 illustrates an EL display configured in accordance to another embodiment of the present invention. As shown in FIG. 3, the EL display differs from the EL display in FIG. 2 because the first partially reflective layer 220 is formed on the outer surface 210b of a first transparent conductive layer 210, and a second partially reflective layer 420 is formed on the outer surface 410b of a second transparent conductive layer 410. Therefore, light reflected by the first partially reflective layer 220 and the second partially reflective layer 420 undergoes constructive interference between layers 31,32,33,34,35 as well as the first transparent conductive layer 210 and the second transparent conductive layer 410.

The first transparent conductive layer 210, an EL layer 30, and the second transparent conductive layer 410 are interposed between the first partially reflective layer 220 and the second partially reflective layer 420. The EL layer 30 may include all or some of the following layers: a hole injection layer 31, a hole transport layer 32, a light-emitting layer 33, an electron transport layer 34, and an electron injection layer 35. Preferably, the layers interposed between the first partially reflective layer 220 and the second partially reflective layer 420 are optimized so that light reflected by the first partially reflective layer 220 and the second partially reflective layer 420 undergoes constructive interference.

Figure 4:
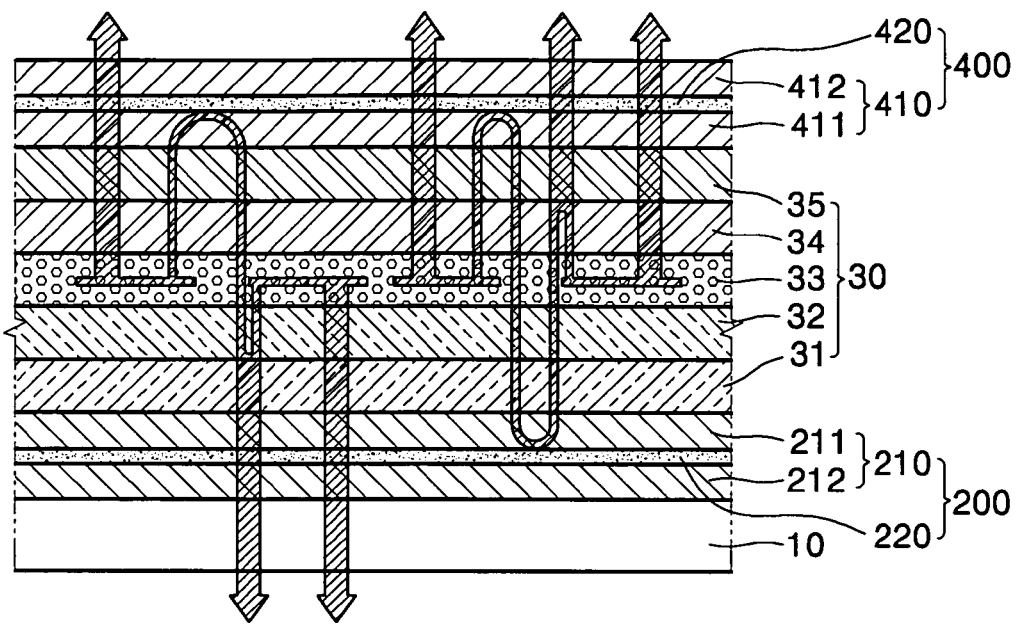
FIG. 4 is a cross-sectional view of an EL display configured in accordance to a third embodiment of the present invention.

FIG. 4 illustrates the present invention configured in accordance to a third embodiment of the present invention. As shown in FIG. 4, the EL display is different from EL display in FIGS. 2 and 3 because a first transparent conductive layer 210 is formed on both surfaces of a first partially reflective layer 220, and a second transparent conductive layer 410 is formed on both surfaces of a second partially reflective layer 420. The first transparent conductive layer 210 includes a first outer transparent conductive layer 212 and a first inner transparent conductive layer 211, and the first partially reflective layer 220 is interposed in between. The second transparent conductive layer 410 includes a second outer transparent conductive layer 412 and a second inner transparent conductive layer 411, and the second partially reflective layer 420 is interposed in between.

When the first partially reflective layer 220 is in direct contact with another organic material layer, problems may result due to a difference in energy levels. In order to solve these problems, the first inner transparent conductive layer 211 must be interposed between the first partially reflective layer 220 and the organic material layer.

In this embodiment, the first inner transparent conductive layer 211, an EL layer 30, and the second inner transparent conductive layer 411 are interposed between the first partially reflective layer 220 and the second partially reflective layer 420. The EL layer 30 may include all or some of the following layers: a hole injection layer 31, a hole transport layer 32, a light-emitting layer 33, an electron transport layer 34, and an electron injection layer 35. Preferably, the layers interposed between the first partially reflective layer 220 and the second partially reflective layer 420 are optimized so that light reflected by the first partially reflective layer 220 and the second partially reflective layer 420 undergoes constructive interference.

Figure 5:
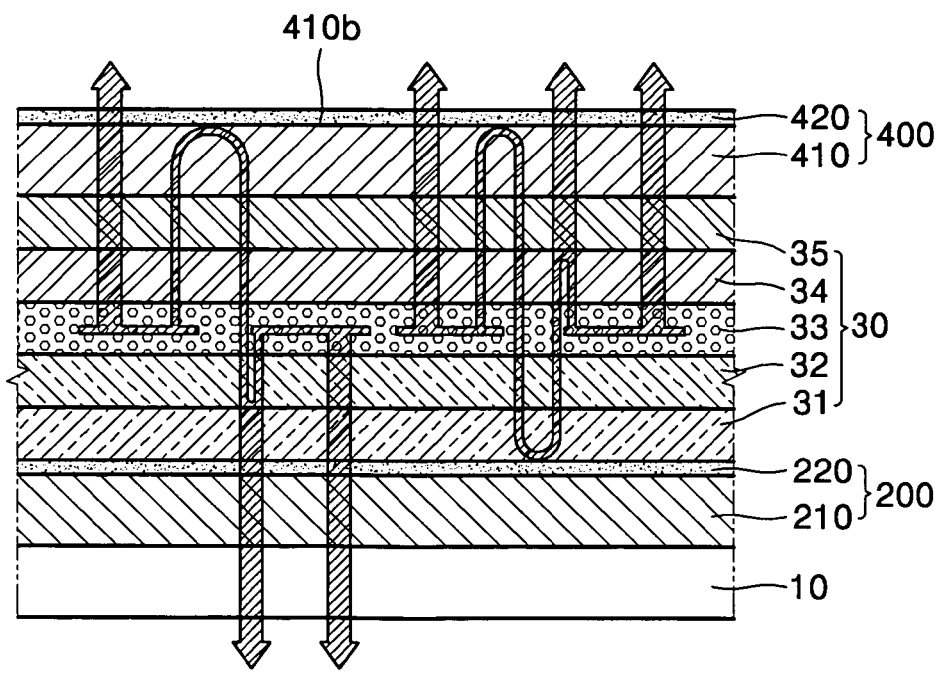
FIG. 5 is a cross-sectional view of an EL display configured in accordance to a fourth embodiment of the present invention.

FIG. 5 illustrates another embodiment of the present invention. This embodiment is a combination of the first embodiment and the second embodiment. The EL display shown in FIG. 5 includes an anode 200 of the first embodiment and a cathode 400 of the second embodiment. Of course, the present invention is not limited to this specific combination. Each of the anodes 200 and cathodes 400 shown in each of the first three embodiments may be interchanged in accordance with the present invention. The EL display is simply one example of such combinations.

As is apparent from the above description, the present invention provides an EL display providing enhancements in luminance, chromaticity, and light efficiency. An EL display configured in accordance with the present invention provides higher luminance, thus enabling power requirements to be reduced while still obtaining a desired luminance. The present invention also provides an EL display that can adjust the amount of light emitted from an anode and a cathode.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An electroluminescent (EL) display, comprising:
   a transparent substrate;
   an anode;
   a cathode; and
   an electroluminescent (EL) layer interposed between the anode and the cathode,
   wherein the EL layer comprises a light emitting layer that emits light when the anode and the cathode are electrically driven,
   wherein the anode and the cathode are each formed as a translucent conductive layer that partially reflects the light emitted from the light-emitting layer,
   wherein the anode comprises a first transparent conductive layer that transmits light and a first partially reflective layer that partially reflects light, and the cathode comprises a second transparent conductive layer that transmits light and a second partially reflective layer that partially reflects light,
   wherein the first transparent conductive layer comprises a first inner transparent conductive layer and a first outer transparent conductive layer, the first partially reflective layer being formed therebetween, and the second transparent conductive layer comprises a second inner transparent conductive layer and a second outer transparent conductive layer, the second partially reflective layer being formed therebetween, and
   wherein the first partially reflective layer and the second partially reflective layer have a light transmittance of 40% or more and a light absorptivity of less than 30%.

2. The EL display of claim 1, wherein the EL layer interposed between the anode and the cathode is formed so that light reflected by the anode and the cathode undergoes constructive interference by a resonance effect.

3. The EL display of claim 1, wherein the first partially reflective layer is formed on an inner surface of the first transparent conductive layer.

4. The EL display of claim 1, wherein the second partially reflective layer is formed on an inner surface of the second transparent conductive layer.

5. The EL display of claim 1, wherein the first partially reflective layer is formed on an inner surface of the first transparent conductive layer.

6. The EL display of claim 1, wherein the second partially reflective layer is formed on an outer surface of the second transparent conductive layer.

7. The EL display of claim 1, wherein layers interposed between the first partially reflective layer and the second partially reflective layer are formed so that light reflected by the first partially reflective layer and the second partially reflective layer undergoes constructive interference by a resonance effect.

8. The EL display of claim 1, wherein the first transparent conductive layer is made of a transparent material selected from the group consisting of ITO, IZO, and ZnO.

9. The EL display of claim 1, wherein the first transparent conductive layer is made of a transparent material selected from the group consisting of ITO, IZO, and ZnO.

10. The EL display of claim 1, wherein the first partially reflective layer is made of a partially reflective material selected from the group consisting of Ag, Mg, Al, Pt, Pd, Au, Ni, lr, and Cr or similar material.

11. The EL display of claim 1, wherein the second partially reflective layer is made of a partially reflective material selected from the group consisting of Mg:Ag, Mg, Ca, Al, Ag, and Ba or similar material.

12. The EL display of claim 1, wherein the first transparent conductive layer and the second transparent conductive layer have a thickness of about 50 to about 300 nm.

13. The EL display of claim 1, wherein the first partially reflective layer and the second partially reflective layer have a thickness of about 3 to about 30 nm.

14. The EL display of claim 1, wherein the distance between the first partially reflective layer and the second partially reflective layer is in the range of about 50 to about 500 nm.

15. The EL display of claim 1, wherein the first partially reflective layer and the second partially reflective layer have a light absorptivity of less than 30%.

16. An electroluminescent (EL) display, comprising:
   a transparent substrate;
   an anode;
   a cathode; and
   an electroluminescent (EL) layer interposed between the anode and the cathode,
   wherein the EL layer comprises a light emitting layer that emits light when the anode and the cathode are electrically driven,
   wherein the anode and the cathode are each formed as a translucent conductive layer that partially reflects the light emitted from the light-emitting layer,
   wherein the anode comprises a first transparent conductive layer that transmits light and a first partially reflective layer that partially reflects light, and the cathode comprises a second transparent conductive layer that transmits light and a second partially reflective layer that partially reflects light,
   wherein the first partially reflective layer and the second partially reflective layer have a light transmittance of 40% or more, and
   wherein the first partially reflective layer and the second partially reflective layer have a light absorptivity of less than 30%.

17. The EL display of claim 16, wherein the first partially reflective layer and the second partially reflective layer have a light reflectivity of 40% or more.

* * * * *